(12) United States Patent
Huang et al.

(10) Patent No.: US 9,480,169 B2
(45) Date of Patent: Oct. 25, 2016

(54) PLUG CONNECTOR ASSEMBLY WITH IMPROVED APPEARANCE

(71) Applicant: FOXCONN INTERCONNECT TECHNOLOGY LIMITED, Grand Cayman (KY)

(72) Inventors: Shuai-Hui Huang, Kunshan (CN); Ru-Yang Guo, Kunshan (CN); Qing-Man Zhu, Kunshan (CN); Jerry Wu, Irvine, CA (US)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 14/604,771

(22) Filed: Jan. 26, 2015

(65) Prior Publication Data

US 2015/0214679 A1    Jul. 30, 2015

(30) Foreign Application Priority Data

Jan. 24, 2014    (CN) .......................... 2014 1 0032714

(51) Int. Cl.
| | |
|---|---|
| H01R 24/00 | (2011.01) |
| H05K 3/30 | (2006.01) |
| H01R 13/504 | (2006.01) |
| H01R 13/66 | (2006.01) |

(52) U.S. Cl.
CPC ............ *H05K 3/301* (2013.01); *H01R 13/504* (2013.01); *H01R 13/6658* (2013.01); *H05K 3/306* (2013.01); *H05K 2201/083* (2013.01); *H05K 2201/10189* (2013.01); *Y10T 29/49147* (2015.01)

(58) Field of Classification Search
CPC ....... H05K 3/301; H05K 3/30; H01R 13/504

USPC .................................. 439/676, 759, 76.1
See application file for complete search history.

(56) References Cited

U.S. PATENT DOCUMENTS

| | | | | |
|---|---|---|---|---|
| 7,247,046 | B1 * | 7/2007 | Wu ..................... | H01R 13/6691 439/490 |
| 7,306,479 | B1 * | 12/2007 | Wu ......................... | H01R 9/034 439/497 |
| 7,540,773 | B2 * | 6/2009 | Ko ...................... | H01R 13/5808 439/581 |
| 7,654,856 | B2 * | 2/2010 | Wu ......................... | H01R 4/023 439/460 |
| 7,722,363 | B2 * | 5/2010 | Zhou .................... | H01R 12/515 439/490 |
| 7,753,689 | B1 * | 7/2010 | Wu ...................... | H01R 13/648 439/490 |
| 7,914,320 | B2 * | 3/2011 | Ko ...................... | H01R 13/502 439/490 |
| 8,011,935 | B2 * | 9/2011 | Ko ...................... | H01R 13/5845 439/490 |
| 8,535,088 | B2 | 9/2013 | Gao et al. | |
| D691,563 | S * | 10/2013 | Yong ........................... | D13/147 |
| 9,017,092 | B1 * | 4/2015 | McCracken ........... | H01R 13/62 439/374 |

(Continued)

*Primary Examiner* — Tulsidas C Patel
*Assistant Examiner* — Peter G Leigh
(74) *Attorney, Agent, or Firm* — Wei Te Chung; Ming Chieh Chang

(57) ABSTRACT

A plug connector assembly for mating with a mating connector including a plug connector comprising an insulative cover defining a receiving space, a printed circuit board (PCB) received in the insulative cover, a mating member mounted on the insulative cover and electrically connected with the PCB, and a front stopple; and a cable connected to the plug connector; wherein the insulative cover comprises a front port and an opposite rear port for the cable to extend through, a channel extends from the front port to the rear port and is connected with the receiving space to extend the mating member out of the insulative cover, and the front stopple fills the front port and the channel.

20 Claims, 6 Drawing Sheets

(56) References Cited

U.S. PATENT DOCUMENTS

2011/0092081 A1* 4/2011 Gao .................. H01R 9/03
439/40

2014/0179126 A1* 6/2014 Gao .................. H01R 9/03
439/40

* cited by examiner

PLUG CONNECTOR ASSEMBLY WITH IMPROVED APPEARANCE

BACKGROUND OF THE INVENTION

1. Field of the Invention

The present invention relates to a plug connector assembly, and more particularly to the insulative cover of the plug connector assembly.

2. Description of Related Arts

U.S. Pat. No. 8,535,088, issued on Sep. 17, 2013, discloses a cable plug including housing, strain relief, cable, subassembly, front plate, attraction plate, and circuit board. During assembly, cable is inserted through housing such that cable emerges from an opening in the housing. The strain relief is then applied to the cable. And the circuit board is affixed to the subassembly. The front plate and the attraction plate are attached. This assembly may then fit through the opening in the housing as the cable is pulled away from the housing. The extent to which cable is pulled may be determined by a manufacturing fixture. To facilitate the passage of strain relief through housing, glue may be used. The glue provides lubrication as strain relief passes through housing. The glue further acts as an adhesive when dry to fix strain relief and cable in place relative to housing. The sizes of assembly, front plate, attraction plate need be small enough to be inserted. It is not suitable for larger size components to be inserted into the housing. It is further inconvenient to insert front plate and attraction plate after mounting the subassembly and the circuit board.

An improved plug connector assembly is desired to offer advantages over the related art.

SUMMARY OF THE INVENTION

An object of the present invention is to provide a plug connector assembly, and more particularly to a plug connector assembly with beautiful appearance and less cost.

To achieve the above-mentioned object, a plug connector assembly for mating with a mating connector includes: a plug connector comprising an insulative cover defining a receiving space, a printed circuit board (PCB) received in the insulative cover, a mating member mounted on the insulative cover and electrically connected with the PCB, and a front stopple; and a cable connected to the plug connector; wherein the insulative cover comprises a front port and an opposite rear port for the cable to extend through, a channel extends from the front port to the rear port and is connected with the receiving space to extend the mating member out of the insulative cover, and the front stopple fills the front port and the channel.

According to the present invention, the insulative cover is assembled to the mating member in such a way that there is no seam on the insulative cover. At the same time, the strain relief is not required so as to reduce production cost.

DETAILED DESCRIPTION OF THE PREFERRED EMBODIMENT

Figure 1:
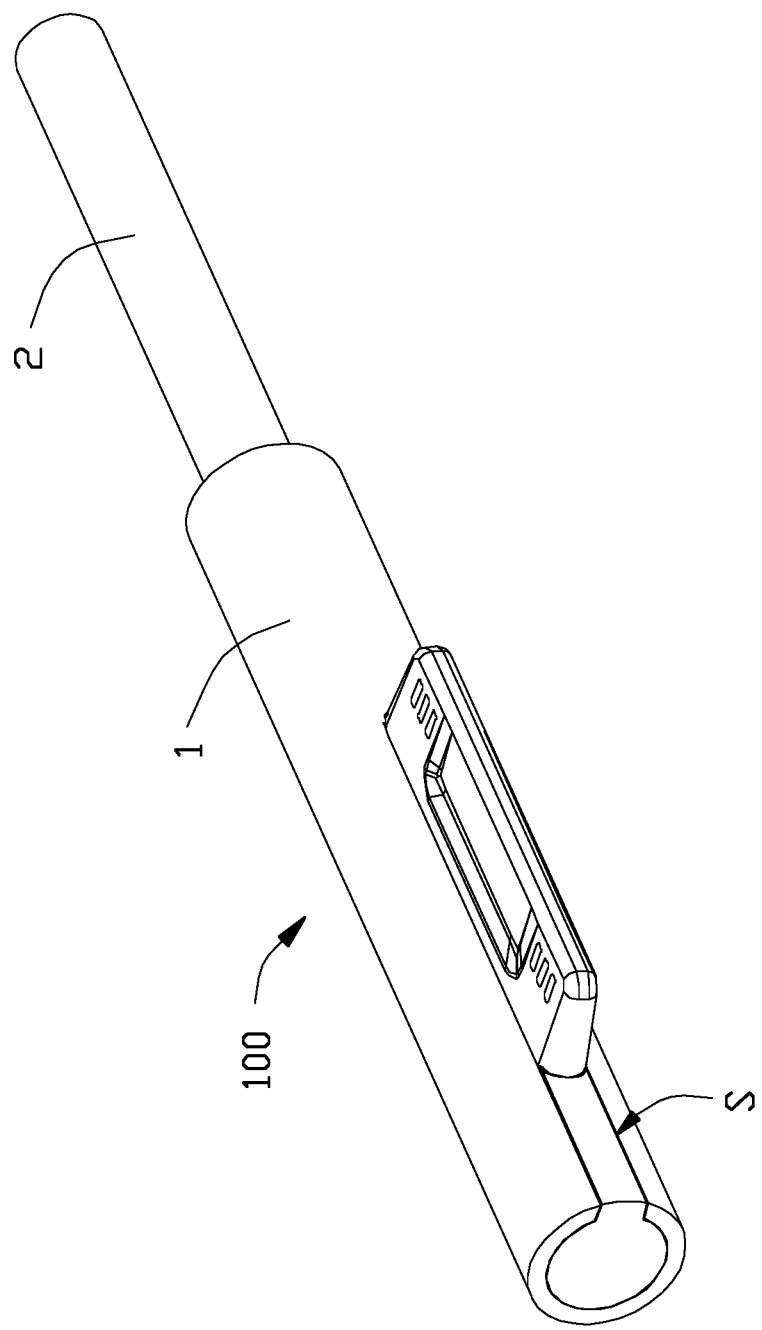
FIG. 1 is a perspective view of a plug connector assembly in accordance with the present invention.
Figure 2:
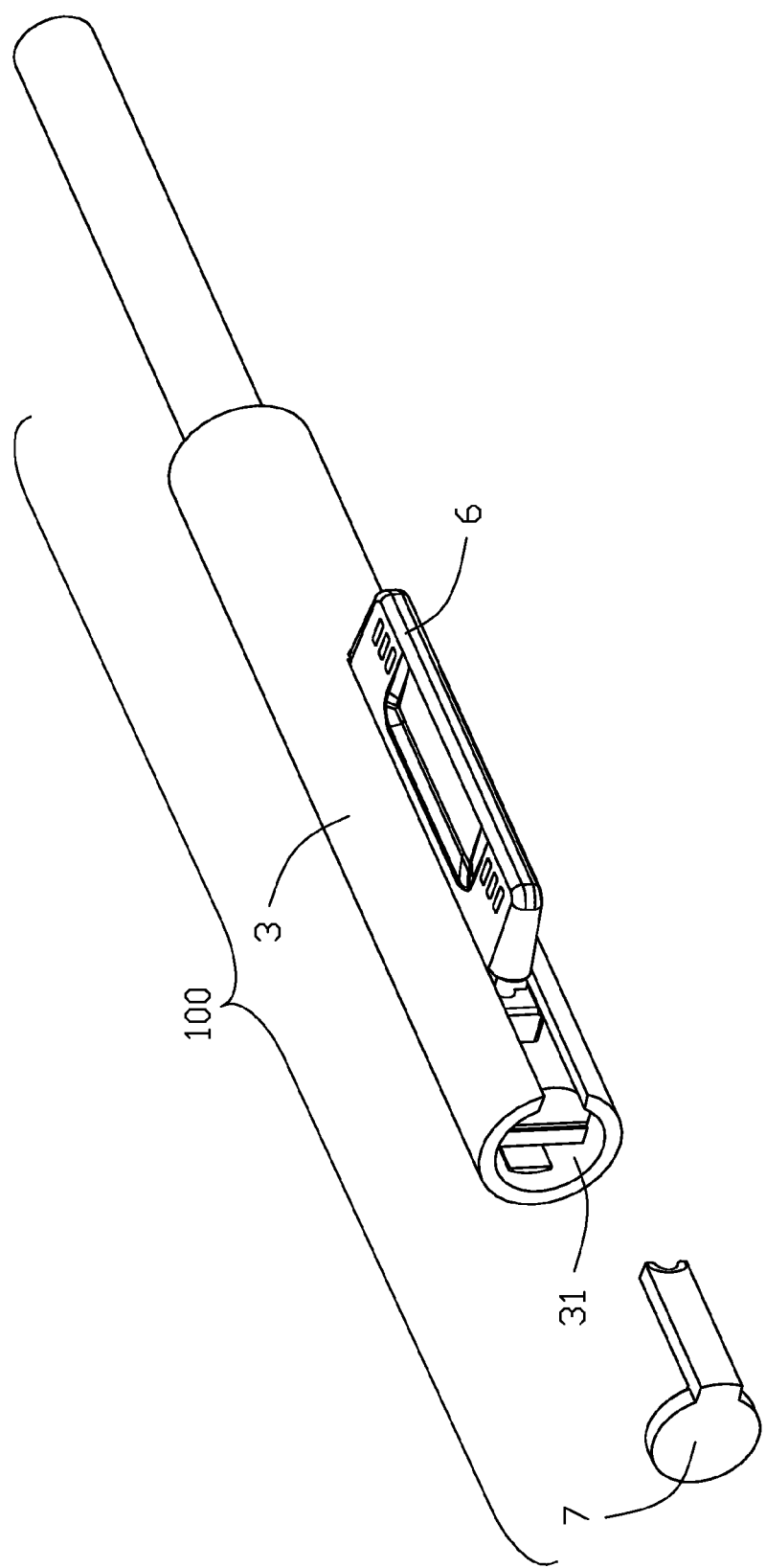
FIG. 2 is a partly exploded view of the plug connector assembly as shown in FIG. 1.
Figure 3:
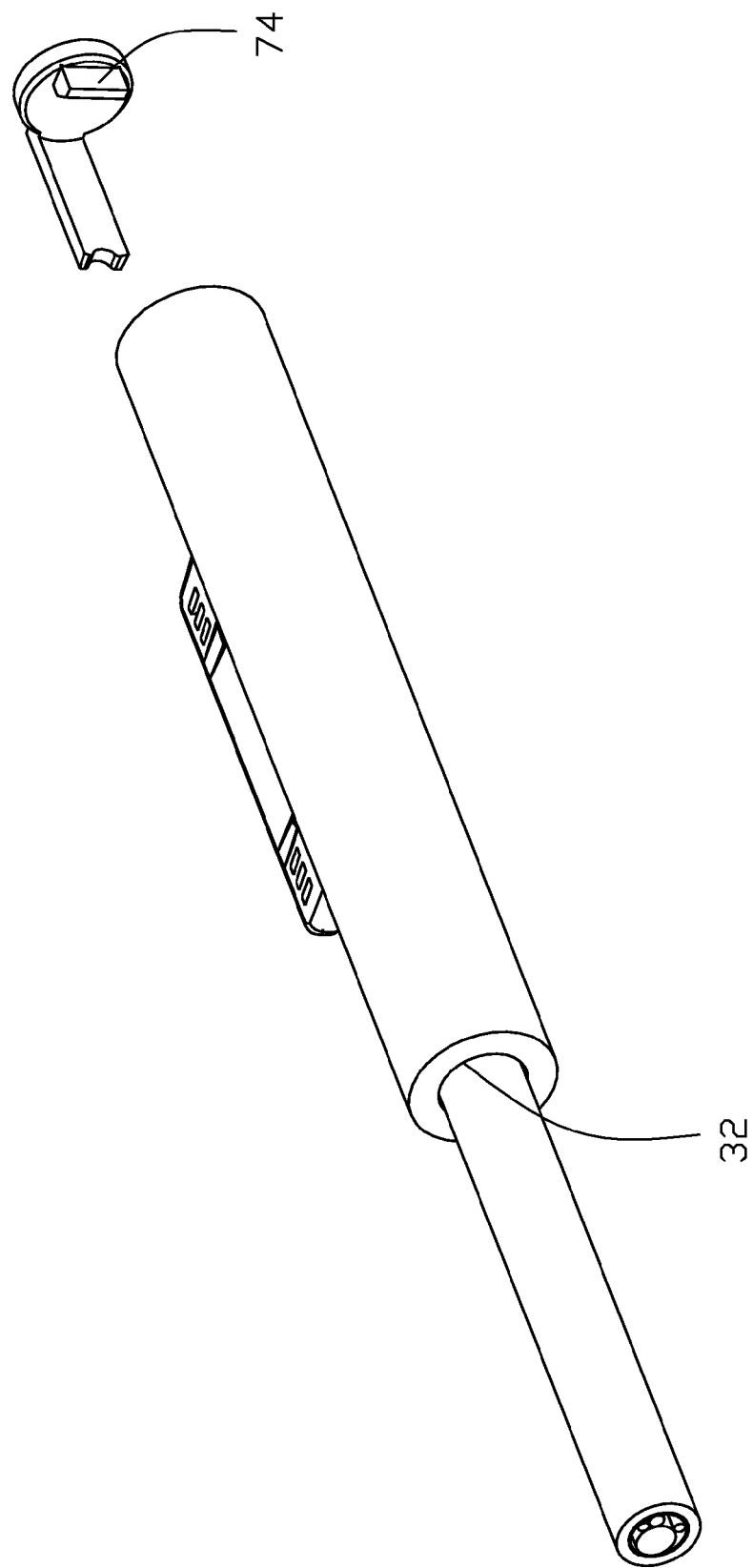
FIG. 3 is another partly exploded view of the plug connector assembly as shown in FIG. 2.
Figure 4:
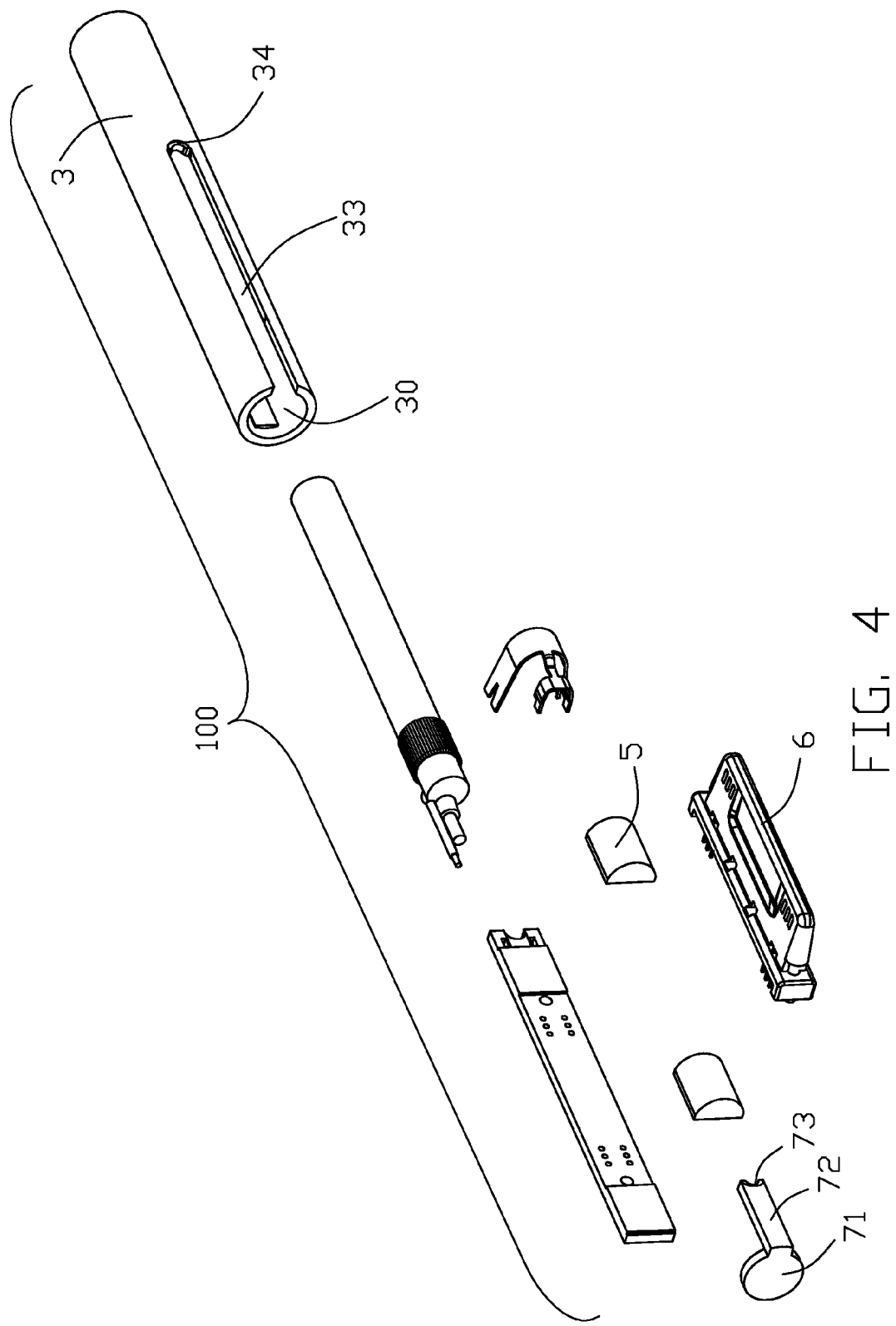
FIG. 4 is an exploded view of the plug connector assembly as shown in FIG. 1.

Reference will now be made in detail to some preferred embodiments of the present invention.

Referring to FIGS. 1 to 4, a plug connector assembly 100 mated with a mating connector (not shown) comprises a plug connector 1 and a cable 2 connected to the plug connector 1. The plug connector 1 comprises an insulative cover 3 defining a receiving space 30, a printed circuit board (PCB) 4 received in the insulative cover 3, a magnetic member 5 mounted on the PCB 4, a mating member 6 mounted on a side wall of the insulative cover 3 and electrically connected with the PCB 4, and a front stopple 7 mounted on an end of the insulative cover 3.

The insulative cover 3 is cylindrical and comprises a front port or opening 31 and an opposite rear port or opening 32 for being extended by the cable 2. A channel 33 extends along a direction from the front port 31 to the rear port 32 of the insulative cover 3. The channel 33 is connected with the receiving space 30 for being extended by the mating member 6 out of the insulative cover 3 to mate with the mating connector. An end of the channel 33 of the insulative cover 3 comprises a second curved area 34.

Figure 5:
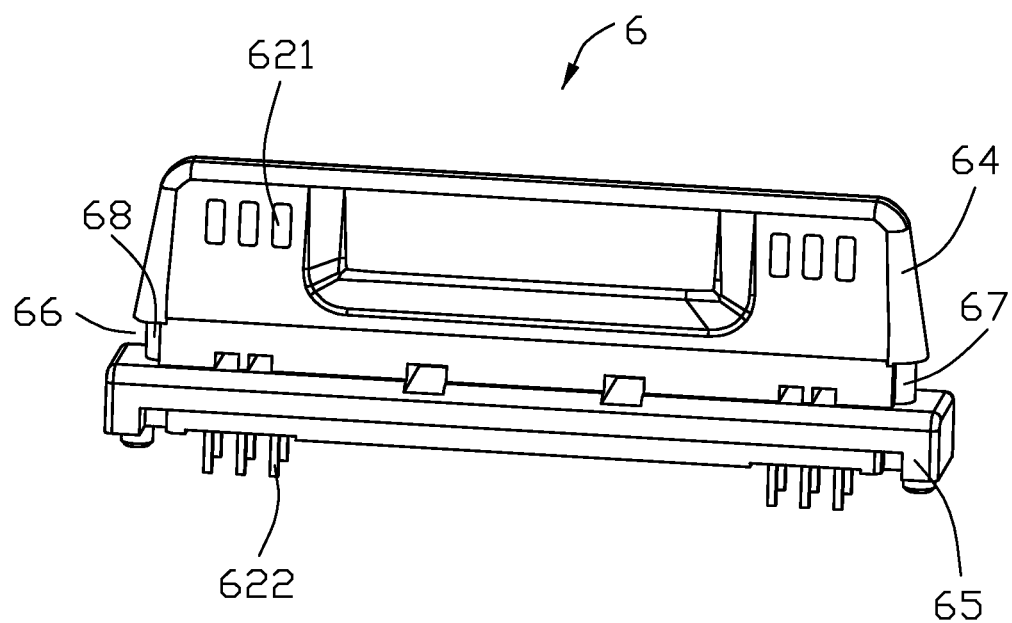
FIG. 5 is a perspective view of the mating member of the plug connector assembly as shown in FIG. 1.
Figure 6:
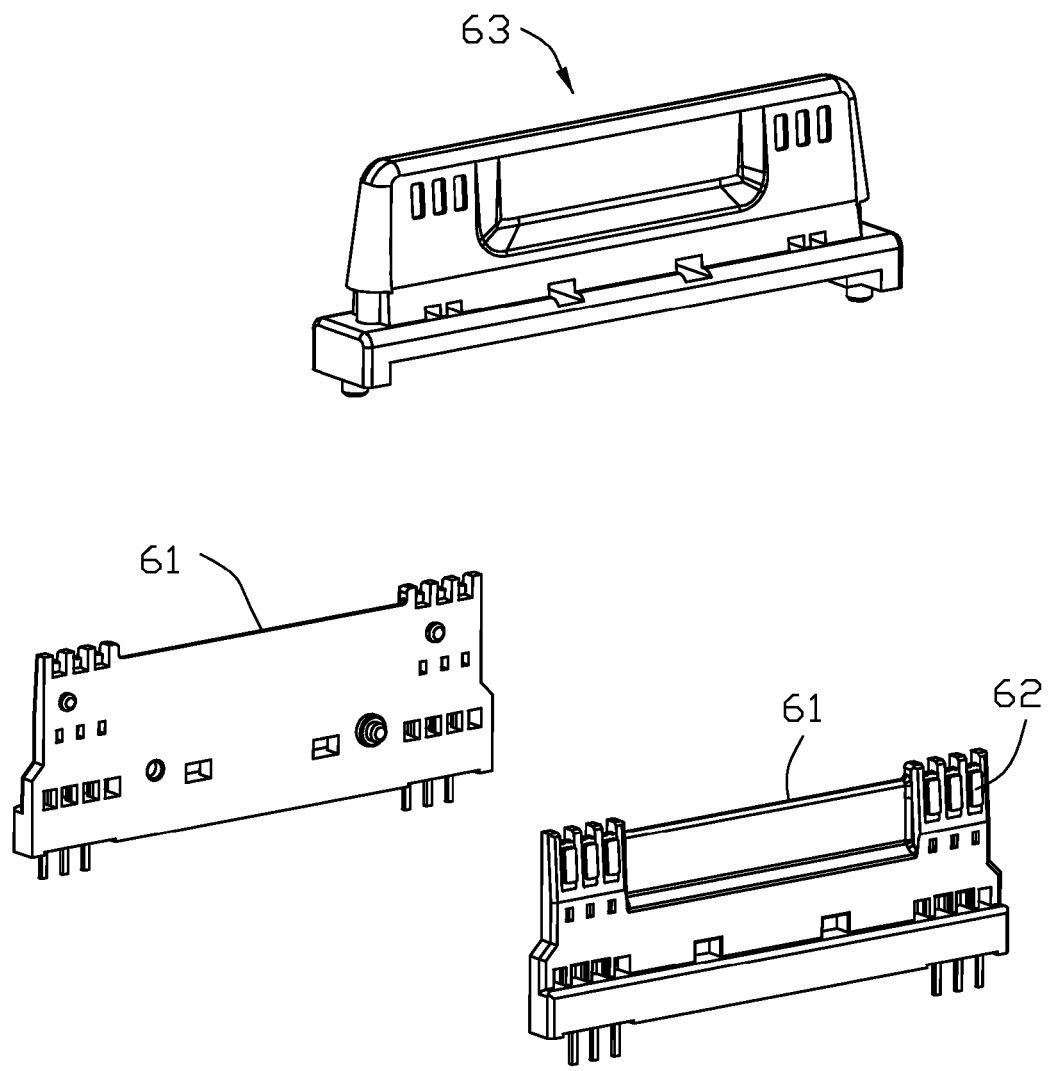
FIG. 6 is an exploded view of the mating member as shown in FIG. 5.

Referring to FIGS. 5 and 6, the mating member 6 comprises an insulative body 61, a plurality of terminals 62 disposed on the insulative body 61, and a housing 63 coating the insulative body 61 and the terminals 62. The housing 63 comprises a mating portion 64 for mating with the mating connector (not shown) and a mounting portion 65 received in the insulative cover 3. Two sides of the mating portion 64 closed to the mounting portion 65 recess inwardly to form a holding slot 66 respectively. One side of the mating portion 64 comprises a second projection 68 in the holding slot 66 mating with the second curved area 34, and another side of the mating portion 64 projecting outwardly to from a first projection 67 in the holding slot 66. The second curved area 34 mates with the second projection 68 increasing the contacting area of the insulative cover 3 with the holding slot 66, so that the mating member 6 will be fixed more firmly with the insulative cover 3 when using glue. The mating member 6 comprises two insulative bodies 61. The pair of the insulative bodies 61 have the same structure so that the plug connector 1 can be inserted into the mating connector in two directions. The housing 63 is molded to enclose the pair of the insulative bodies 61 after being mechanically assembled together. Each terminal 62 comprises a contacting portion 621 exposed out of the mating portion 64 of the housing 63 for completing electrically connection with the mating connector and a soldering portion 622 extending out of the mounting portion 65 of the housing 63 for being soldered with the PCB 4.

The front stopple 7 is used for filling the front port 31 and filling the channel 33 cooperated with the mating member 6. The front stopple 7 comprises a main portion 71 mating with the front port 31 of the insulative cover 3 and a protruding portion 72 extending from the main portion 71. The protruding portion 72 interference fits with the holding slot 66 to fill the channel 33 cooperated with the mating member 6. A front end of the protruding portion 72 recesses to the direction of the main portion 71 to form a first curved area 73. The first curved area 73 mates with the first projection 67 increasing a contacting area of the protruding portion 72 with the holding slot 66. The front stopple 7 further comprises a supporting blocker 74 protruding outwardly from the main portion 71. When the front stopple 7 mounted on the insulative cover, the supporting blocker 74 is supported against the PCB 4 to make the PCB 4 stable in the insulative cover 3.

When assembling the plug connector assembly 100, mount the terminals 62 in the insulative bodies 61. Mold the housing 63 to the insulative bodies 61 after mechanically assembling the pair of insulative bodies 61 together. The contacting portion 621 of the terminal 62 is exposed out of the mating portion 64, and the soldering portion 622 extends out of the mounting portion 65 of the housing 63. Solder the cable 2 to the PCB 4. Set the magnetic member 5 on the PCB 4. Solder the mating member 6 on the PCB 4. The assembling sequence of the cable 2, the magnetic member 5, and the soldering of the mating member 6 is not sole.

Set the insulative cover 3 to the PCB 4 and the mating member 6 from the cable 2 until the end of the channel 33 against the holding slot 66 of the mating member 6. In other words, the PCB 4 with the mating member 6 is mounted rearwardly into the receiving space 30 from the front port 31 in the axial direction and the mating member 6 moves along the channel 33 in the axial direction and extends out of the channel 33 in a radial direction. Mount the front stopple 7 on the end of the insulative cover 3 and filling a breach of the insulative cover 3. At this time, the protruding portion 72 of the front stopple 7 is held with another holding slot 66 of the mating member 6. At last, use glue to fill a seam S of between the front stopple 7 and the insulative cover 3. Notably, in some alternate embodiment, the front stopple may be replaced with the rear stopple.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A plug connector assembly for mating with a mating connector, comprising:
    a plug connector comprising an insulative cover defining a receiving space, a printed circuit board (PCB) received in the insulative cover, a mating member mounted on the insulative cover and electrically connected with the PCB, and a front stopple; and
    a cable connected to the plug connector; wherein
    the insulative cover comprises a front port and an opposite rear port for the cable to extend through, a channel extends from the front port to the rear port and is connected with the receiving space to extend the mating member out of the insulative cover, and the front stopple fills the front port and the channel; wherein
    before the front stopple fills the front port, said front port is forwardly open to an exterior in a front-to-back direction so as to allow said PCB and said mating member to be rearwardly mounted into the receiving space along said front-to-back direction through said front port.

2. The plug connector assembly as recited in claim 1, wherein the mating member comprises an insulative body, a plurality of terminals disposed on the insulative body, and a housing the insulative body and the terminals.

3. The plug connector assembly as recited in claim 2, wherein the housing comprises a mating portion for mating with a mating connector and a mounting portion received in the insulative cover, each of two opposite sides of the mating portion being recessed inwardly to form a holding slot.

4. The plug connector assembly as recited in claim 3, wherein the front stopple comprises a main portion mating with the front port of the insulative cover and a protruding portion extending from the main portion, the protruding portion interference fitting with the holding slot to fill the channel.

5. The plug connector assembly as recited in claim 4, wherein a front end of the protruding portion recesses toward the main portion to form a first curved area, and one side of the mating portion projects outwardly to from a first projection mating with the first curved area in the holding slot to increase a contacting area of the protruding portion with the holding slot.

6. The plug connector assembly as recited in claim 5, wherein an end of the channel of the insulative cover comprises a second curved area, and another side of the mating portion comprises a second projection mating with the second curved area to increase the contacting area of the insulative cover with the holding slot.

7. The plug connector assembly as recited in claim 6, wherein a seam is formed between the front stopple and the insulative cover and glue is provided to fill the seam.

8. The plug connector assembly as recited in claim 2, wherein the mating member comprises two insulative bodies, and the housing is molded to enclose the two insulative bodies.

9. The plug connector assembly as recited in claim 1, wherein the front stopple comprises a supporting blocker protruding outwardly from the main portion, the supporting blocker stably supporting the PCB in the insulative cover.

10. The plug connector assembly as recited in claim 1, wherein the insulative cover is cylindrical.

11. A plug connector assembly comprising:
    a tubular cover forming a receiving space extending along an axial direction, and a channel extending along said axial direction to communicating said receiving space with an exterior in a radial direction perpendicular to said axial direction;
    a printed circuit board disposed within the receiving space;
    a cable mechanically and electrically connected to the printed circuit board;
    a mating member mounted upon the printed circuit board and outwardly extending through said channel in said radial direction toward the exterior, said mating member including a plurality of contacts thereof; wherein
    said channel is originally configured to communicate with an exterior in the axial direction to allow the mating member to be assembled with regard to the tubular cover along the axial direction, and a stopple fills remainder of the channel after the mating member and the printed circuit board is mounted into the tubular cover so as to prevent withdrawal of the mating member from the tubular cover in the axial direction.

12. The plug connector assembly as claimed 11, wherein the mating member is configured and dimensioned with an internal enlarged portion to prevent the mating member from being outwardly dropped off from the tubular cover through said channel in said radial direction.

13. The plug connector assembly as claimed in claim 11, wherein said stopple and said tubular cover are configured to have said stopple to be assembled to the tubular cover along said axial direction.

14. The plug connector assembly as claimed in claim 11, wherein the tubular cover defines a front open end allowing receipt of the printed circuit board and the mating member during assembling, and a rear open end allowing extension of the cable, and said channel communicates with the front end while being isolated from the rear end so as to have said mating member assembled into the tubular cover rearwardly from the front end and the stopple is filled within the channel and the front end after the mating member is assembled into the tubular cover.

15. The plug connector assembly as claimed in claim 11, wherein said tubular cover is cylindrical and the mating member is vertically mounted upon the printed circuit board.

16. A method of assembling a plug connector assembly, comprising steps of:
  providing a tubular cover with an internal receiving space along an axial direction, a channel along said axial direction to communicate said receiving space with an exterior in a radial direction perpendicular to said axial direction, and an axial end open to the exterior in said axial direction;
  providing a printed circuit board adapted to be received in said receiving space through said end;
  mounting a mating member including a plurality of contacts thereof, upon the printed circuit board;
  mounting a cable to the printed circuit board;
  assembling the printed circuit board with the associated mating member into the receiving space along said axial direction via said end and said channel wherein the mating member extends through said channel in said radial direction toward the exterior; and
  assembling a stopple to the tubular cover to prevent withdrawal of the printed circuit board an the associated mating member from the tubular cover in said axial direction backwardly.

17. The method as claimed in claim 16, wherein said end is a front end of the tubular cover for assembling, and the cable extends out of the tubular cover via a rear end of the tubular cover.

18. The method as claimed in claim 16, wherein said mating member is dimensioned and configured with an internal enlarged portion to prevent said mating member from being dropped off through the channel to the exterior.

19. The method as claimed in claim 16, wherein said stopple includes a main portion covering the end to unveil the internal receiving space in the axial direction, and a protruding portion extending from the main portion and filling remainders of the channel after assembled to unveil the internal receiving space in the radial direction.

20. The method as claimed in claim 16, wherein said cable is connected to the printed circuit board at a position behind another position where the mating member is connected to the printed circuit board in said front-to-back direction.

* * * * *